(12) United States Patent
Eussen et al.

(10) Patent No.: US 8,614,783 B2
(45) Date of Patent: Dec. 24, 2013

(54) ENCODER-TYPE MEASUREMENT SYSTEM, LITHOGRAPHIC APPARATUS AND METHOD TO DETECT AN ERROR ON OR IN A GRID OR GRATING OF AN ENCODER-TYPE MEASUREMENT SYSTEM

(75) Inventors: Emiel Jozef Melanie Eussen, Eindhoven (NL); Engelbertus Antonius Fransiscus Van Der Pasch, Oirschot (NL); Robbert Edgar Van Leeuwen, Eindhoven (NL); Renatus Gerardus Klaver, Eindhoven (NL); Martijn Robert Hamers, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 877 days.

(21) Appl. No.: 12/392,852

(22) Filed: Feb. 25, 2009

(65) Prior Publication Data

US 2009/0237634 A1    Sep. 24, 2009

Related U.S. Application Data

(60) Provisional application No. 61/064,727, filed on Mar. 24, 2008.

(51) Int. Cl.
*G03B 27/52* (2006.01)
*G03B 27/58* (2006.01)

(52) U.S. Cl.
USPC ............................................... 355/30; 355/72

(58) Field of Classification Search
USPC .............. 355/53, 67, 30, 72; 356/614; 702/94
See application file for complete search history.

(56) References Cited

U.S. PATENT DOCUMENTS

| | | | | |
|---|---|---|---|---|
| 5,610,715 A | * | 3/1997 | Yoshii et al. | 356/499 |
| 5,877,035 A | * | 3/1999 | Fujino et al. | 438/16 |
| 7,894,037 B2 | * | 2/2011 | Bleeker et al. | 355/30 |
| 7,903,866 B2 | * | 3/2011 | Van Der Wijst et al. | 382/144 |
| 2008/0094594 A1 | * | 4/2008 | Shibazaki | 355/53 |
| 2009/0004580 A1 | * | 1/2009 | Kanaya | 430/22 |
| 2010/0296068 A1 | * | 11/2010 | Shibazaki | 355/30 |

* cited by examiner

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

An encoder-type measurement system is configured to measure a position dependent signal of a movable object. The measurement system includes a light source and a sensor. The light source and the sensor are mounted on one of the movable object or a substantially stationary frame. The measurement system also includes a reference object that includes a grating or grid mounted on the other of the movable object or the substantially stationary frame. The light source is configured to emit a light beam towards the reference object. The sensor is configured to detect light of the light source reflected by the reference object. The measurement system also includes an error detector capable of detecting errors in or on the grating or grid of the sensor target object during a continuous production process.

34 Claims, 4 Drawing Sheets

ENCODER-TYPE MEASUREMENT SYSTEM, LITHOGRAPHIC APPARATUS AND METHOD TO DETECT AN ERROR ON OR IN A GRID OR GRATING OF AN ENCODER-TYPE MEASUREMENT SYSTEM

CROSS REFERENCE TO RELATED APPLICATIONS

This application claims priority and benefit under 35 U.S.C. §119(e) to U.S. Provisional Patent Application No. 61/064,727, entitled "Encoder-Type Measurement System, Lithographic Apparatus and Method To Detect An Error On Or In A Grid Or Grating Of An Encoder-Type Measurement System", filed on Mar. 24, 2008. The content of that application is incorporated herein in its entirety by reference

FIELD

The present invention relates to an encoder-type measurement system, a lithographic apparatus and a method to detect an error on or in a grid or grating of an encoder-type measurement system lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a measurement system is used for determining the position of a substrate stage with high accuracy (e.g. nanometer accuracy). Due to a continuing demand for higher throughput and increased accuracy, it is desirable to improve the accuracy of measurement systems used in the lithographic apparatus, in particular for the measurement systems with which the position of the substrate stage and reticle stage are measured, and typically in six degrees of freedom.

In an embodiment of the measurement system, an encoder type measurement system is used. Such encoder-type measurement system may comprise one or more sensors mounted on the movable object and at least one sensor target object, for instance a sensor target plate comprising a grating or grid, the sensor target object mounted on a substantially stationary frame, in particular a so-called metrology frame (metro-frame). The sensor target object may comprise a one-dimensional or multi dimensional grating. In an embodiment, the sensor target object will be typically in the form of a plate on which a two dimensional orthogonal grid is arranged. Such sensor target object is often referred to as grid, grating or grid plate.

In alternative embodiments, the one or more sensors may be mounted on the substantially stationary frame and the sensor target object may be mounted on the movable object. The grid sensor target object, for instance grating or grid plate comprises grid lines or other grid markings which are used to determine a change in position of the grid plate with respect to the one or more sensors.

Position control is carried out by measuring the position of the sensor with respect to the sensor target object in one or more degrees of freedom. The grid plate may comprise irregularities such as manufacture errors, local pollution or damage which may cause errors in the position measurement. Also, droplets of the liquid of an immersion type lithographic apparatus on the grid or grating may cause errors in the grid or grating. In the context of the present application local pollution, damage and droplets or particles which cause an error in the grid or grating are regarded to be errors.

The presence of an error on a grid or grating may lead to incorrect positioning of the patterning device support or substrate table with respect to the optical axis of the lithographic apparatus. As a result, the image of a patterned beam of radiation which is projected on a target portion of the substrate is not correctly positioned on the substrate. Such imaging errors such as overlay and/or focus errors, may lead to inferior product quality, or even complete rejection of the substrates. In this respect it is remarked that the quality of the wafers may only be determined after complete production of the wafers. Therefore, the presence of grid or grating errors may result in a large impact on the production of the lithographic apparatus. Thus it is desirable to take grid or grating errors into account.

In lithographic apparatus, it is known to calibrate the grid or grating. In such calibration method, the complete grid or grating is scanned on irregularities. A map of the grid or grating is made of any irregularities such as errors. This calibration map is used during actual position measurement to correct incorrect measurements due to the presence of errors.

The calibration of the grid or grating may improve the position measurement of the position measurement system since the known errors are taken into account. However, errors which come into existence after the calibration step, such as pollution, damage, droplets or particles, will not be known in the correction map. The presence of such errors may still lead to the imaging errors in a large number of substrates. To avoid the risks on bad product quality of the substrates, the calibration step may be repeated regularly to map new errors in the calibration map. However, increasing the number of calibrations may have a negative influence on the overall throughput of the lithographic apparatus.

SUMMARY

It is desirable to provide a position measurement in which the risks on erroneous positioning of a movable object due to errors in the grid or grating are reduced.

According to an embodiment of the invention, there is provided an encoder-type measurement system that is configured to measure a position dependent signal of a movable object. The measurement system includes a light source and a sensor. The light source and the sensor are mounted on one of the movable object or a substantially stationary frame. The measurement system also includes a reference object that includes a grating or grid mounted on the other of the movable object or the substantially stationary frame. The light source is configured to emit a light beam towards the reference object. The sensor is configured to detect light of the light source reflected by the reference object. The measurement system also includes an error detector capable of detecting errors in or on the grating or grid of the sensor target object during a continuous production process. The error detector includes a monitor configured to monitor one or more variables, and a comparator configured to provide one or more comparison signals on the basis of a comparison of the one or more monitored variables with one or more reference values of the variables. The one or more comparison signals are representative of a presence of an error on or in the grating or grid.

According to an embodiment of the invention, there is provided an encoder-type measurement system that is configured to measure a position dependent signal of a movable object. The measurement system includes a light source and a sensor. The light source and the sensor are mounted on one of the movable object or a substantially stationary frame. The measurement system also includes a reference object that includes a grating or grid mounted on the other of the movable object or the substantially stationary frame. The light source is configured to emit a light beam towards the reference object. The sensor is configured to detect light of the light source reflected by the reference object. The measurement system also includes a cleaning device constructed and arranged to clean the grating or grid.

According to an embodiment of the invention, there is provided a method for detecting an error on a grid or grating of an encoder-type position measurement system. The method includes monitoring one or more variables relating to position measurement or position control of a movable object, and comparing the one or more monitored variables with one or more reference variables. The comparing results in one or more comparison signals being representative of a presence of an error on or in the grid or grating.

According to an embodiment of the invention, there is provided a lithographic apparatus that includes an illumination system configured to condition a radiation beam, and a patterning device support constructed to support a patterning device. The patterning device is capable of imparting the radiation beam with a pattern in its cross-section to form a patterned radiation beam. The apparatus also includes a substrate table constructed to hold a substrate, a projection system configured to project the patterned radiation beam onto a target portion of the substrate, and an encoder-type measurement system configured to measure a position dependent signal of a movable object. The measurement system includes a light source and a sensor. The light source and the sensor are mounted on one of the movable object or a substantially stationary frame. The measurement system also includes a reference object that includes a grating or grid mounted on the other of the movable object or the substantially stationary frame. The light source is configured to emit a light beam towards the reference object. The sensor is configured to detect light of the light source reflected by the reference object. The measurement system also includes an error detector capable of detecting errors in or on the grating or grid of the sensor target object during a continuous production process. The error detector includes a monitor configured to monitor one or more variables, and a comparator configured to provide one or more comparison signals on the basis of a comparison of the one or more monitored variables with one or more reference values of the variables. The one or more comparison signals are representative of a presence of an error on or in the grating or grid. The measurement system is configured to measure a position dependent signal of the patterning device support or substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
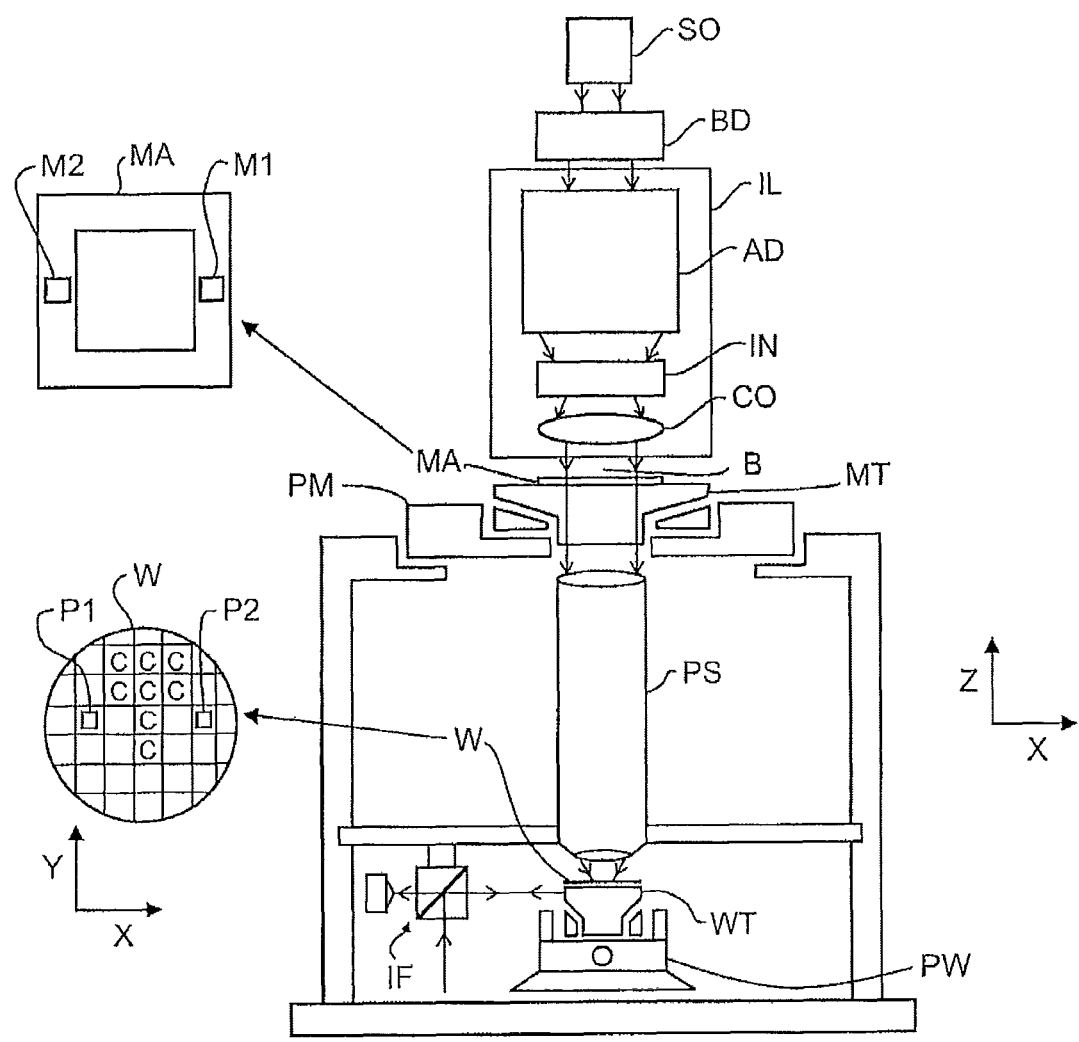
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the miltor matrix, The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable pattering device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
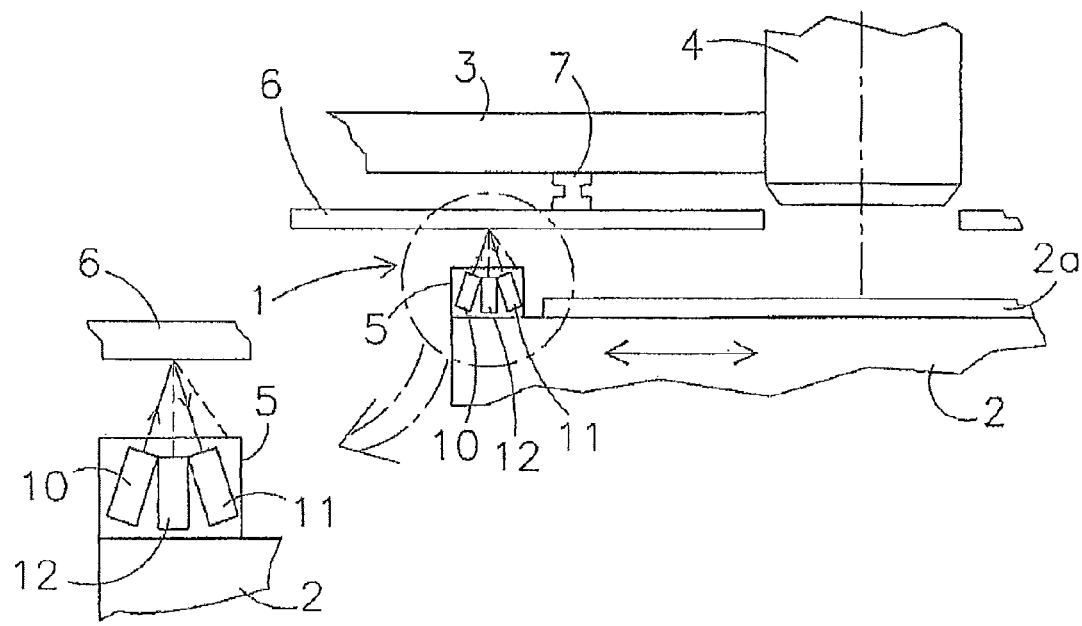
FIG. 2 depicts an error detector of the lithographic apparatus of FIG. 1 according to an embodiment of the invention.

FIG. 2 shows a side view of an embodiment of a measurement system according to the present invention, generally indicated with the reference numeral 1. The measurement system 1 is configured to measure the position of a substrate stage 2 supporting a substrate 2a with respect to a so-called metrology frame or metro-frame 3. The metro-frame 3 is a substantially stationary frame, to which a lens column 4 of the projection system is mounted. In this respect it is remarked that a substantially stationary frame may be any frame which is passively or actively held in a substantially stationary position. The metro-frame 3 of a lithographic apparatus may be mounted with passive or active air-mounts on a base frame to filter any external disturbances such as vibrations in the factory floor. In this way, the lens column may be held in a substantially stationary position. During a scanning movement of the substrate stage, it is desired to know the position of the substrate stage with respect to the lens column. Therefore, a position measurement system 1 is provided with which the position of the substrate stage with respect to the metro-frame 3 can be determined.

The measurement system 1 comprises one or more encoder heads 5 which are used to determine the change in position of the substrate stage with respect to a grid plate 6. The grid plate 6 comprises a large number of grid lines or spots which are used for determining the position of the one or more encoder heads 5 with respect to the grid plate 6. The term grid plate as used in this application may refer to any type of object which is provided with a grid or grating as part of a measurement system. Such a measurement system is usually referred to as an encoder-type measurement system and is known in the art.

The grid plate 6 comprises a central hole for the lens column 4 and is mounted on the metro-frame 3 with a number of mounting devices 7 (only one shown in FIG. 2).

Each encoder head 5 comprises a light source 10 emitting a light beam (shown in solid line) towards the grid plate 6 and a sensor 11 sensing the light reflected from the grid plate 6. On the basis of the reflected light, a position of the substrate stage 5 may be determined. In practice, three or more encoder heads 5 may be provided, each capable of measuring a position of the substrate stage 2 in two degrees of freedom, making position measurement in six degrees of freedom possible. Using the encoder-type measurement system a position measurement with high accuracy is possible. Any other suitable configuration of encoder heads may also be applied.

The grid plate 6 may comprise irregularities such as manufacture errors, local pollution or damage which may cause errors in the position measurement. Also, droplets of the liquid of an immersion type lithographic apparatus on the grid or grating may cause errors in the grid or grating. In the context of the present application term error may also relate to local pollution, damage and droplets or particles which cause an error in the grid or grating.

The presence of an error on a grid or grating may lead to incorrect positioning of the patterning device support or substrate table for instance with respect to the optical axis of the lithographic apparatus. As a result, the image of a patterned beam of radiation which is projected on a target portion of the substrate is not correctly positioned on the substrate.

The effect of errors may be avoided by calibration of the grid or grating before actual use of the position measurement system. However, errors which come into existence after the calibration step, such as pollution, damage, droplets or particles, will not be known in the correction map. The presence of such errors may still lead to imaging errors affecting a large number of substrates.

Thus, it is desirable to know at an early stage that an error is present in a grid or grating. According to embodiments of the invention, it is proposed to provide an error detector which is capable to detect an error in the grid or grating during the lithographic process. Preferably, the detection of errors on the grid or grating is performed continuously during the lithographic process.

Error detection during the lithographic process makes it possible to directly detect the presence of an error on or in the grid and grating, and further measures may be taken before the lithographic process is continued. For instance, it may be possible to recalibrate the grid or grating so that the new error or errors are incorporated in the calibration map. In an alternative embodiment, a cleaning device may be provided, which is capable of cleaning the error, in case the error is caused by pollution, droplets or particles.

By detecting an error at an early stage, the risk on the production of a relative large quantity of defect products or products having a poor quality may be decreased.

In the embodiment of FIG. 2, a first possible solution for detection of errors during the lithographic process is shown.

In the measurement system 1 as shown in FIG. 2, only light diffractions of a specific order of the grid or grating are used for position measurement of the substrate stage 2. The internal lay-out of the encoder head is optimized so that sensor 11 only receives the diffractions of the order used for position measurement. For instance, if only the first order diffraction is used for position measurement, the encoder head 5 may be configured in such a way that the sensor 11 will substantially only receive first order diffractions.

However, the grid or grating may also provide other order diffractions, or scattering in general. The intensity of the scattering will be dependent on the grid or grating and may be measured by a scattering light sensor 12, for instance a stray-light sensor. During a calibration step, the intensity of the scattering at a certain location of the respective encoder head 5 with respect to the grid or grating may be measured and stored in a scattering map. During the lithographic process the scattering, for instance other order diffractions of the grid plate may be measured by the scattering light sensor 12 and compared to the intensity of scattering as stored in the scattering map. When there is at a certain location of the substrate stage 2 with respect to the grid plate 6 a substantial difference in the measured intensity of scattering and the intensity as stored in the scattering map, this may indicate the presence of an error at that location.

Thus, by using the scattering light sensor 12, the presence of errors on or in the grid plate 6 may continuously be monitored during the lithographic process, in particular when a patterned beam of radiation is projected on the substrate supported on the substrate stage.

As explained above, the knowledge that an error may be present on or in the grid plate 6 may be used to re-calibrate the grid map or to start a cleaning action. As an alternative, it may be decided to continue the lithographic process, accepting an error at a certain location on the substrate. In such case it is beneficial to know that an imaging error may be present in a substrate at a certain location so that this imaging error may be taken into account in further processing of the substrate.

An above-described embodiment of the error detector was applied in a measurement system 1 of a substrate stage 2. It is also possible to apply such a measurement system 1 for position measurement and control for another type of movable object, in particular a patterning device support. In such an embodiment, continuous error control during the lithographic process may be even more applicable since an error in the grid plate of the encoder-type position measurement system 1 of a patterning device support may lead to an imaging error in each image projected on a substrate, thereby resulting in a large number of errors distributed over the substrate.

In the embodiment of FIG. 2, use is made of a scattering sensor 12 which is for instance configured to detect other order diffractions of a light beam (shown in dashed lines) emitted by a light source 10 towards the grid plate 6. Generally, the scattering sensor 12 will be configured to detect changes in intensity of reflections of the grid plate, preferably other than the diffraction of the specific order or orders used by the sensor 11. This may be diffraction orders, but also other scatterings of the grid or grating.

In an embodiment, a separate light source-sensor combination may be used to detect an error on the grid plate 6. Such embodiment has the disadvantage of the need of a separate light source 10. Furthermore, the light source will normally be configured to emit a beam of light to a different location than the location to which the light source 11 emits a beam of light. As a result, the position and error will not be measured at exactly the same location. Directing the beam of light of the second light source to the same measuring location may lead to disturbing light in the position measurement light detection by sensor 11.

In the embodiment of FIG. 2, at least one additional sensor 12 is used in order to perform error detection during the lithographic process. In an embodiment, it is possible to perform a grid or grating error detection without the use of an additional sensor as now will be explained.

Figure 3:
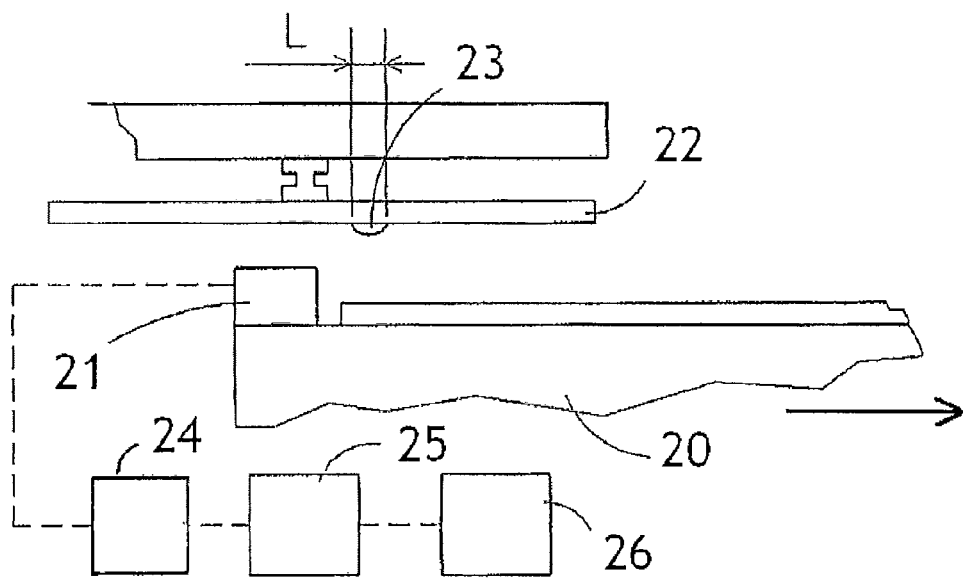
FIG. 3 depicts an error detector of the lithographic apparatus according to an embodiment of the invention.

FIG. 3 shows a schematic side view of a stage 20 having an encoder head 21 and a grid plate 22. An error 23 having dimension L is present on the grid plate 22. This error may be any irregularity on or in the grid plate 22, such as damage to the grid plate 22, for instance a scratch, or pollution of the grid plate 22, for instance a particle or an (immersion liquid) droplet.

The presence of the error 23 on or in the grid plate 22 may lead to unexpected behavior of the measurement system 1, or the position control system in which it used. This unexpected behavior of signals of the measurement system or position control system may be used to determine an error 23.

For this reason, the error detector of the measurement system comprises a monitor 24 configured to monitor one or more variables relating to position measurement or position control of the movable object, and a comparator 25 configured to provide one or more comparison signals on the basis of a comparison of the one or more monitored variables with one or more reference variables, the one or more comparison signals being representative for the presence of an error on or in the grid or grating.

The one or more variables which are monitored by the monitor 24 may for instance comprise one or more of the sensor signal amplitude, sensor signal phase, position servo error, controller drive input, and/or motion profile. Preferably, a combination of these signals is monitored and compared to normal behavior of the signals.

The monitor 24 comprises a device measuring and collecting the different signals which are monitored. For instance, the monitor comprises the encoder-head 21 and/or a collection device collecting the variables of the encoder-head 21, such as sensor signal amplitude and sensor signal phase. The comparison device compares the monitored variables with reference values which are for instance obtained during calibration of the measurement system. When there is a substantial difference between monitored behavior and reference behavior, an error may be present on or in the grid plate 22. Consequently, a cleaning action or calibration step may be taken to prevent any negative influence of the error on the production quality of a lithographic apparatus.

The comparison values may be obtained by several methods. For example the one or more reference values may be a fixed value, a calibrated map, a moving average over neighboring samples, or a prediction based on a motion profile, or a prediction based on the past examples of other variables. It will be clear that all these values alone or in combination may be used to obtain a map of reference values.

To further improve the error detection accuracy a filter or correlation device 26 may be provided to filter or correlate one or more of the comparison signals, i.e. the signals resulting from comparison of the monitored variables and the reference values. The filter or correlation device may for instance take specific situation of the stage into account, such as specific beam layout, stage speed, servo bandwidth or other specific behavior of the measurement system of movable object. To explain this in more detail a example will now be given.

Again referring to FIG. 3, depending on the speed of the stage v, the dimension of the error L in the direction of movement, and the bandwidth of the position control system of the stage 20, the stage 20 will or will not be able to follow the error 23.

For instance, when the dimension L of the error divided by the speed v of the stage 20 is smaller than the bandwidth BW of the position control system of the stage 20, (L/v<BW), the servo can follow the disturbance. As a result, the disturbance will be visible in the motor-current, but not in servo-error, position measurement, or controller output. When in contrast, the dimension L of the error divided by the speed v of the stage 20 is larger than the bandwidth BW of the position control system of the stage 20, (L/v>BW), the servo cannot follow the disturbance. As a result, the disturbance will be visible in position measurement and in servo-error.

Taking this knowledge into account, different variables may be used to predict the presence of an error on or in the grid plate 22 dependent on the actual speed of the stage 20. Also, some variables may be correlated to more accurately predict the presence of an error on or in the grid plate 22.

The monitor 24 and comparator 25 may be integrated in a single device, or be part of another processing unit of the lithographic apparatus.

Hereinabove, it was explained how during the actual production process the presence of errors on or in the grid plate may be predicted. When an error has been found, further measures may be taken to clean the error in case it is caused by pollution, such as particles or (immersion liquid) droplets, or to re-calibrate the grid plate so that the error will be taken into account during position measurement. In certain cases it is desired to clean the error as the error may alter after re-calibration of the grid plate. For instance, certain particles may easily relocate due to the moving stage close to the grid plate, and droplets of liquid may evaporate in the course of time. When such errors would be calibrated, after a certain time again an error could come into existence. For these types of errors cleaning is thus preferred.

In state of the art lithographic apparatus, cleaning of the grid plate was carried out by opening of the lithographic apparatus and cleaning of the surface of the grid plate by manual cleaning. This method is time-consuming and also has the risk of damage of the grid plate since the person cleaning the grid plate may easily make a scratch on the grid plate.

The present invention provides a number of embodiments of cleaning devices which are capable of cleaning an error caused by a particle or droplet without having the need to open the lithographic apparatus. Each of the cleaning devices may be used after an error has been detected by the error detector as described in relation to FIGS. 2 and 3. However, it is also possible to implement these cleaning devices without error detection during the lithographic process.

Figure 4:
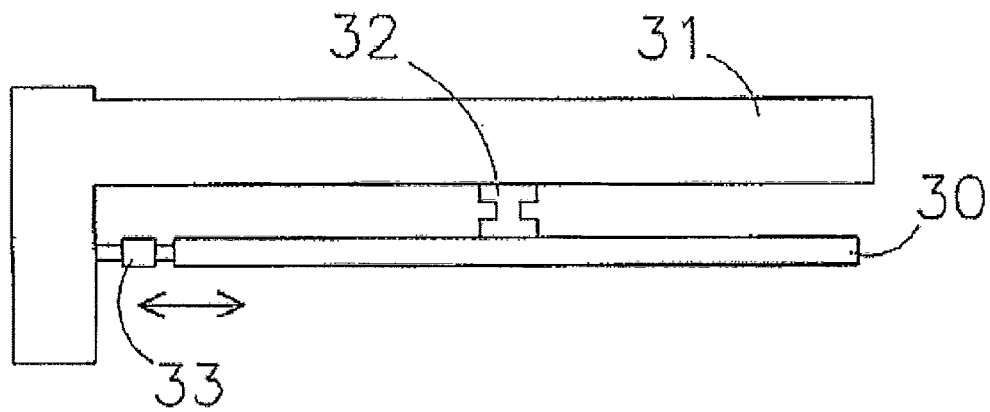
FIG. 4 depicts an embodiment of a cleaning device for a grid or grating of an encoder-type position measurement system of the lithographic apparatus.

FIG. 4 shows a grid plate 30, which is mounted on a frame 31, for instance a metro-frame. The grid plate 30 is mounted to the frame 31 by flexible mounts 32. An actuator 33 is provided between the grid plate 30 and the frame 31. When an error is detected on the grid plate 31, and it is expected that the error is caused by a particle on droplet on the grid plate 30, the actuator 33 may be actuated to move the grid plate 30 with respect to the frame, preferably a vibrating movement having a relative high frequency and a low amplitude. As a result of this movement, the particle on the grid plate 30 may brake free from the grid plate 30 therewith removing the error of the grid plate 30. The actuator 33 may be any actuator which is capable of providing a suitable movement, typically vibrating movement of the grid plate 30. The actuator 33 may be an actuator which is also used for active damping of movements of the grid plate 30.

Figure 5:
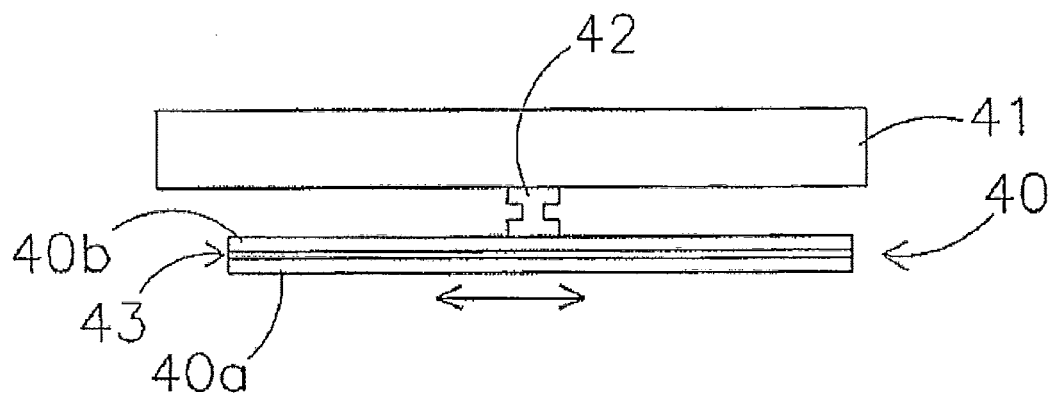
FIG. 5 depicts an embodiment of a cleaning device for a grid or grating of an encoder-type position measurement system.

FIG. 5 again shows a side view of a grid plate 40 mounted on a frame 41. An actuator 43 is provided as a piezo sub-layer in the grid plate 40. The piezo sub layer is a layer of piezo-elements between parts 40a and 40b of the grid plate. Upon actuation of the actuator 43, the part 40a on which the grid or grating is provided will move with respect to the part 40b on which the mounts 42 are attached. The resulting movement of the part 40a is preferably a vibrating movement. By actuation of the lower part 40a with respect to the upper part 40b a particle on the grid plate causing an error may be shaken off the grid plate 40, therewith taking the cause of the error away.

Figure 6:
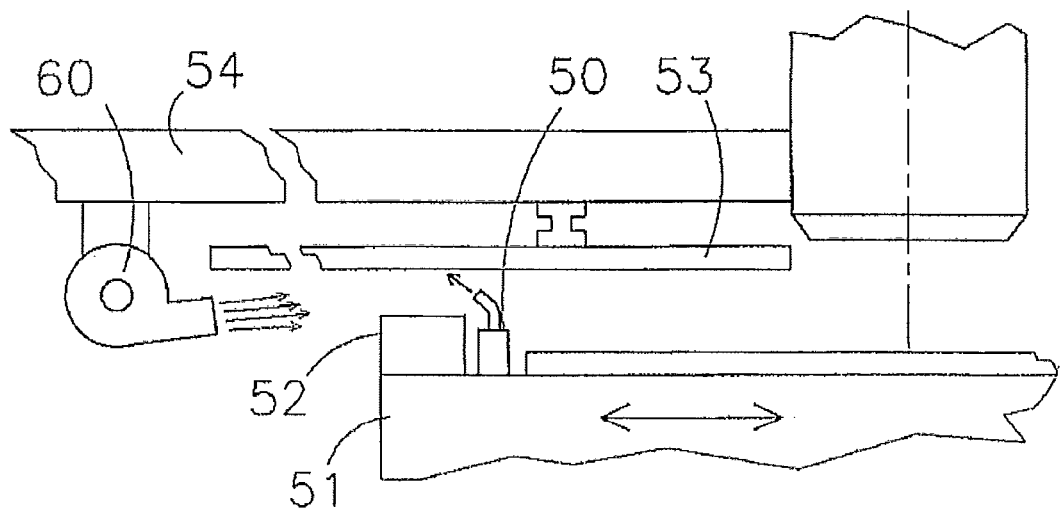
FIG. 6 depicts an embodiment of a cleaning device for a grid or grating of an encoder-type position measurement system.

FIG. 6 shows another example of a cleaning device 50 according to the invention in the form of a fluid jetting device. Also this cleaning device 50 is suitable for cleaning a particle or droplet present on the grid plate 53. The fluid jetting device 50 is mounted on a stage 51 preferably close to an encoder head 52. The fluid jetting device 50 is configured to provide, when desired, a fluid jet towards the grid plate 53. As soon as an error is detected by an error detector, or during a calibration run, a fluid jet is generated and directed towards the location of the error. In case, the error is caused by a particle, the particle may be blown away from the grid plate 53. When a droplet is present the fluid jetting device 50 may be used to blow away the droplet or may increase substantially the speed with which the liquid of the droplet evaporates.

Furthermore, in the embodiment of FIG. 6 a fluid flow forming device 60 is provided. Fluid flow forming device 60 is configured to provide a relative large fluid flow along the surface of the grid plate 53 on which the grid or grating is provided. Such fluid flow may be used to blow a particle or droplet off the grid plate 53, or may substantially increase the speed of evaporation of a droplet being present on the grid plate 53. The main difference between the fluid jetting device 50 and the fluid flow forming device 60 is that the fluid jetting device 50 is configured to provide locally a fluid jet towards the location of the error, while the fluid flow forming device 60 is configured to provide a relative large fluid flow along the surface of the grid plate 53. The fluid jetting device 50 will typically be mounted on a movable object, preferably on the stage 51. The fluid flow forming device 60 will typically be arranged at a stationary location for instance mounted on frame 54.

The fluid jetting device 50 and the fluid flow forming device 60 may be separately applied or as a combination. In particular the fluid jetting device may be useful to blow a particle or droplet off the grid plate 53, while the fluid flow forming device 60 may be suitable to prevent that such free particle will again stick to the grid plate 53 at another location, therewith causing a new error on the grid plate 53.

The fluid jetting device and/or the fluid flow forming device 60 may also be used in combination with any other cleaning device which is configured to clean a particle or droplet on a grid or grating of a reference object of an encoder-type measurement system.

The fluid jetting device 50 and the fluid flow forming device 60 use a gas jet or gas flow. In such an embodiment, the fluid jetting device 50 and the fluid flow forming device 60 may use compressed gas of a compressed gas source or may have a gas pump itself, such as a ventilator or such. The gas may be an inert gas and/or a gas taken from the process environment.

Figure 7:
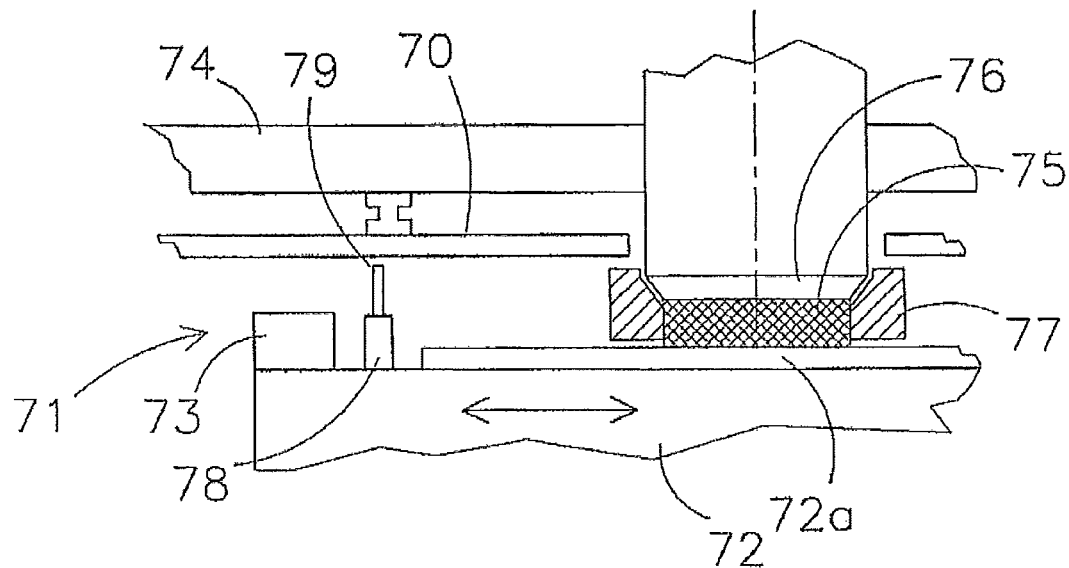
FIG. 7 depicts an embodiment of a cleaning device for a grid or grating of an encoder-type position measurement system.

FIG. 7 shows an embodiment of a cleaning device for cleaning an error on a grid plate 70 of a position measurement system 71. The position measurement system 71 is configured to measure the position of a stage 72 supporting a substrate 72a. The position measurement system 71 comprises one or more encoder heads 73 mounted on the stage 72 and the grid plate 70 mounted on a frame 74. The stage 72 and position measurement system 71 are part of a lithographic apparatus having an immersion system 75. In such a lithographic apparatus a quantity of liquid is held between a final lens element 76 of the projection system and a substrate to improve the projection of a patterned beam on the substrate. In particular, the presence of liquid is used to mitigate the unfavorable change in refractive index between the final lens element 76 and air.

An immersion head 77 is provided to substantially prevent liquid from leaking to the sides. To avoid damage to the substrate there is a gap between the immersion head 77 and the substrate 72a. Although the immersion head 77 is configured to prevent leakage, it is always possible that liquid escapes from the immersion liquid space. Liquid escaping from the immersion liquid space may result in a droplet of immersion liquid on the grid plate 70. As explained above, such a droplet may form an error during position measurement, in particular when the droplet has a size over 1 mm.

A droplet removal device 78 is provided to clean a droplet of the grid plate. The droplet removal device 78 which is mounted on the stage 72 comprises a removal element 79 which extends close to the grid plate 70. When the stage moves in a direction the removal element 79 is also moved parallel the surface of the grid plate 70. When a droplet is present on the surface of the grid plate 70, the removal element 79 will hit the droplet and it will break free from the surface of the grid plate 70.

The droplet removal device may be placed between the encoder head 73 and the immersion system 75, so that droplets may be removed from the grid plate before the encoder head 73 reached the location of the droplet. Therewith, erroneous position measurement may be avoided.

When the stage 72 moves with high speed, it may be desirable to provide a hydrophobic surface on the removal element 79 so that the removal element 79 bounces the droplet of the grid plate 70. When, in contrast, the stage 72 moves at low speed, it may be desirable to provide a hydrophilic surface on the removal element 79 so that the droplet is taken over from the grid plate 70 to the removal element 79.

The surface of the grid plate 70 may also made hydrophobic so that the contact angle of the droplet is relative high. As a result, the droplet should break more easily free from the surface of the grid plate 70. Also, the droplet will be relatively high in comparison with the volume of the droplet. The surfaces of the removal element 79 may be made hydrophobic or hydrophilic by making the removal element at least partially of corresponding material, or by providing a coating on the removal element 79.

The removal element 79 is preferably a skirt like element which surrounds the substrate area, and may for instance have a rectangular or cylindrical shape. The encoder heads 73 are arranged outside this area.

Figure 8:
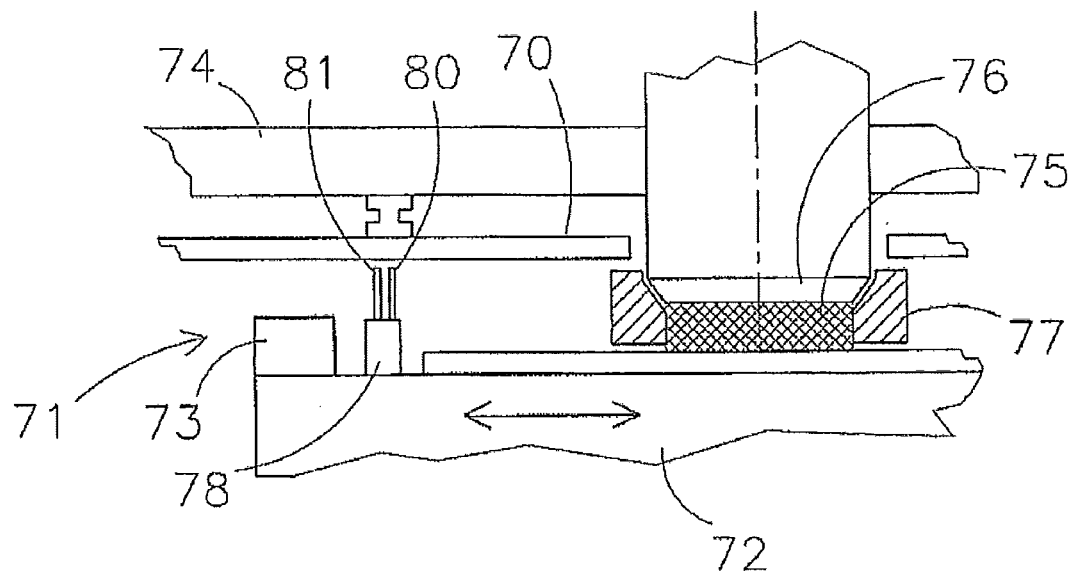
FIG. 8 depicts an embodiment of a cleaning device for a grid or grating of an encoder-type position measurement system.

In an embodiment of the droplet removal device 78, as shown in FIG. 8, the droplet removal device 78 comprises two droplet removal elements 80, 81, a first one 80 having a hydrophobic surface, the second one 81 having a hydrophilic surface to obtain an effective cleaning behavior at low and high speeds of the stage 72. By removing droplets from the grid plate before the encoder head 73 measures at the respective location, reliability of measurements may be improved.

The droplet removal device of FIGS. 7 and 8 may be applied without error detection. The droplets may be continuously cleaned due to the presence of the droplet removal device 78.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An encoder-type measurement system configured to measure a position dependent signal of a movable object, said measurement system comprising:
   a light source and a sensor, said light source and said sensor being mounted on one of said movable object or a substantially stationary frame;
   a reference object comprising a grating or grid mounted on the other of said movable object or said substantially stationary frame, said light source being configured to emit a light beam towards the reference object, said sensor being configured to detect light of said light source reflected by said reference object, wherein a position of the movable object is determined based on one or more signals provided by said sensor using said detected light; and
   an error detector configured to receive the one or more signals and capable of detecting errors in or on said grating or grid of said sensor target object during a continuous production process, said errors being detected using the one or more signals received from said sensor, said light source and said sensor to be used to detect said errors, said error detector comprising
   a monitor configured to monitor one or more variables, and
   a comparator configured to provide one or more comparison signals on the basis of a comparison of the one or more monitored variables with one or more reference values of said variables, the one or more comparison signals being representative of a presence of an error on or in said grating or grid.

2. The measurement system of claim 1, wherein said error detector is configured to continuously detect errors in or on said reference object.

3. The measurement system of claim 1, wherein said monitor comprises an error detection sensor, said error detection sensor being configured to detect scattering light of said grating or grid.

4. The measurement system of claim 3, wherein said sensor is configured to detect diffraction of a specific order, and the error detection sensor is configured to detect scattering light other than said diffraction of said specific order.

5. The measurement system of claim 3, wherein said light source, said sensor, and said error detection sensor are integrated in a single device.

6. The measurement system of claim 5, wherein said single device is mounted on said movable object.

7. The measurement system of claim 1, wherein said one or more monitored variable are variables of said position measurement system of a position control system in which the position measurement system is used.

8. The measurement system of claim 1, wherein said one or more monitored variables comprise the sensor signal amplitude, sensor signal phase, position servo error, controller drive input, motion profile, or any combination thereof.

9. The measurement system of claim 1, wherein said one or more reference values comprise a fixed value, a calibrated map, a moving average over neighboring samples, a prediction based on a motion profile, a prediction based on the past examples of other variables, or any combination thereof.

10. The measurement system of claim 1, wherein said error detector comprises a filter or correlation device configured to filter and/or correlate the one or more comparison signals.

11. The measurement system of claim 10, wherein said filter or correlation device is based on specific beam layout, stage speed, servo bandwidth or other specific behavior of said measurement system of said movable object.

12. The measurement system of claim 1, further comprising a cleaning device constructed and arranged to clean said grating or grid.

13. The measurement system of claim 1, further comprising a plurality of lights sources and a plurality of sensors mounted on the one of said movable object or said substantially stationary frame.

14. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
the encoder-type measurement system of claim 1, said measurement system being configured to measure a position dependent signal of said patterning device support or substrate table.

15. The lithographic apparatus of claim 14, wherein said measurement system is configured to detect an error on or in said grating or grid during projection of a patterned radiation beam onto a target portion of a substrate.

16. An encoder-type measurement system configured to measure a position dependent signal of a movable object, said measurement system comprising:
a light source and a sensor, said light source and said sensor being mounted on one of said movable object or a substantially stationary frame;
a reference object comprising a grating or grid mounted on the other of said movable object or said substantially stationary frame, said light source being configured to emit a light beam towards the reference object, said sensor being configured to detect light of said light source reflected by said reference object; and
a cleaning device constructed and arranged to clean said grating or grid, said cleaning device being separate from an immersion device for providing liquid between a last optical element of a projection system and a substrate in an immersion lithography apparatus, said cleaning device comprising a first flow forming device configured to provide a first fluid flow over a first area of said grating or grid and a second flow forming device configured to provide a second fluid flow over a local area of said grating or grid where a particle or droplet is located, said local area smaller than said first area.

17. The measurement system of claim 16, wherein said cleaning device comprises an actuator, which is connected to said reference object, said cleaning device being configured to remove a particle causing a grid or grating error by at least partial mechanical actuation of said actuator.

18. The measurement system of claim 16, wherein said second flow forming device is arranged on the movable object.

19. The measurement system of claim 18, wherein said first flow forming device is arranged on a substantially stationary frame.

20. The measurement system of claim 16, wherein said cleaning device comprises a droplet removal device mounted on the one of said movable object or a substantially stationary frame, said droplet removal device being configured to remove a droplet from said grating or grid by contacting the droplet when passing by the droplet during a movement of the movable object with respect to the reference object.

21. The measurement system of claim 20, wherein a contact surface of said droplet removal device comprises a hydrophobic surface to bounce the droplet off the grating or grid.

22. The measurement system of claim 20, wherein a contact surface of said droplet removal device comprises a hydrophilic surface to take the droplet over from the grating or grid.

23. A method for detecting an error on a grid or grating of an encoder-type position measurement system configured to measure a position dependent signal of a movable object, the encoder-type position measurement system including a light source and a sensor, a position of the movable object being determined based on one or more signals provided by said sensor using said detected light, the sensor and light source to be used to detect the error, the method comprising:
monitoring one or more variables relating to position measurement or position control of the movable object using the one or more signals received from said sensor, and
comparing the one or more monitored variables with one or more reference values of said variables, said comparing resulting in one or more comparison signals being representative of a presence of an error on or in said grid or grating.

24. The method of claim 23, wherein said monitoring comprises monitoring one or more of a sensor signal amplitude, a sensor signal phase, a position servo error, a controller drive input, a motion profile, or any combination thereof.

25. The method of claim 23, further comprising filtering and/or correlating the one or more comparison signals.

26. The method of claim 23, further comprising calibrating the grid or grating after an error on or in said grid or grating has been detected.

27. The method of claim 23, further comprising cleaning the grid or grating after an error on or in said grid or grating has been detected.

28. The method of claim 27, further comprising actuating an object comprising said grid or grating to obtain a vibrating movement of said object comprising said grid or grating.

29. A method of cleaning a grid or grating of an encoder-type position measurement system after an error on or in said grid or grating has been detected comprising the cleaning of claim 28.

30. The method of claim 27, wherein said cleaning comprises blowing or purging a fluid to remove a particle or liquid droplet.

31. The method of claim 30, where said blowing or purging a fluid comprises providing a fluid flow locally at the detected location of an error on or in said grid or grating.

32. The method of claim 30, wherein said blowing or purging a fluid comprises providing a large area fluid flow covering a substantial part of the grid or grating.

33. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
an encoder-type measurement system configured to measure a position dependent signal of a movable object, said measurement system comprising
a light source and a sensor, said light source and said sensor being mounted on one of said movable object or a substantially stationary frame;
a reference object comprising a grating or grid mounted on the other of said movable object or said substantially stationary frame, said light source being configured to emit a light beam towards the reference object, said sensor being configured to detect light of said light source reflected by said reference object, wherein a position of the movable object is determined based on one or more signals provided by said sensor using said detected light; and
an error detector configured to receive the one or more signals and capable of detecting errors in or on said grating or grid of said sensor target object during a continuous production process, said errors being detected using the one or more signals received from said sensor, said light source and said sensor to be used to detect said errors, said error detector comprising
a monitor configured to monitor one or more variables, and
a comparator configured to provide one or more comparison signals on the basis of a comparison of the one or more monitored variables with one or more reference values of said variables, the one or more comparison signals being representative of a presence of an error on or in said grating or grid,
said measurement system being configured to measure a position dependent signal of said patterning device support or substrate table.

34. The lithographic apparatus of claim 33, wherein said measurement system is configured to detect an error on or in said grating or grid during projection of a patterned radiation beam onto a target portion of a substrate.

\* \* \* \* \*